(12) United States Patent
Westwick et al.

(10) Patent No.: US 7,233,199 B2
(45) Date of Patent: *Jun. 19, 2007

(54) CIRCUIT AND METHOD OF ESTABLISHING DC BIAS LEVELS IN AN RF POWER AMPLIFIER

(75) Inventors: Alan L. Westwick, Austin, TX (US); Susanne A. Paul, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/278,078

(22) Filed: Mar. 30, 2006

(65) Prior Publication Data

US 2006/0244525 A1  Nov. 2, 2006

Related U.S. Application Data

(63) Continuation of application No. 10/743,221, filed on Dec. 22, 2003, now Pat. No. 7,064,605.

(51) Int. Cl.
*H03F 1/36* (2006.01)

(52) U.S. Cl. ........................................ 330/85; 330/290
(58) Field of Classification Search .................. 330/11, 330/85, 136, 285, 290
See application file for complete search history.

(56) References Cited

U.S. PATENT DOCUMENTS

| | | | |
|---|---|---|---|
| 3,684,975 A | 8/1972 | Valfre | 330/207 P |
| 3,903,485 A | 9/1975 | Dolby | 333/14 |
| 4,024,346 A | 5/1977 | McDermott | 381/121 |
| 4,491,802 A | 1/1985 | Uchida et al. | 330/260 |
| 4,705,967 A | 11/1987 | Vasile | 327/581 |
| 4,771,247 A | 9/1988 | Jacomb-Hood | 330/277 |
| 5,220,209 A | 6/1993 | Seymour | 326/27 |
| 5,374,896 A | 12/1994 | Sato | 330/149 |
| 5,723,994 A | 3/1998 | Ting et al. | 327/174 |
| 5,726,603 A | 3/1998 | Chawla et al. | 330/269 |
| 5,936,458 A | 8/1999 | Rylov | 327/528 |
| 5,945,878 A | 8/1999 | Westwick et al. | 330/301 |
| 6,118,989 A | 9/2000 | Abe et al. | 455/127 |
| 6,252,455 B1 | 6/2001 | Kurby et al. | 330/136 |
| 6,259,325 B1 | 7/2001 | Ishizuka et al. | 330/301 |
| 6,448,847 B1 | 9/2002 | Paul et al. | 327/563 |
| 6,462,620 B1 | 10/2002 | Dupuis et al. | 330/264 |
| 6,549,071 B1 | 4/2003 | Paul et al. | 330/252 |
| 6,586,993 B2 | 7/2003 | Macedo | 330/51 |
| 6,590,446 B2 * | 7/2003 | Nakamura | 330/51 |

(Continued)

OTHER PUBLICATIONS

T. Cho, E. Dukatz, M. Mack, D. Macnally, M. Marringa, S. Mehta, C. Nilson, L. Plouvier, and S. Rabii, "A single-chip CMOS direct-conversion transceiver for 900MHz spread-spectrum digital cordless phones," IEEE International Solid-State Circuits Conference, vol. XLII, Feb. 1999.

*Primary Examiner*—Steven J. Mottola
(74) *Attorney, Agent, or Firm*—Johnson & Associates

(57) ABSTRACT

A method and apparatus is used to provide DC stabilization and noise reduction in a multistage power amplifier. The invention uses various feedback techniques to stabilize DC levels, which helps to reduce noise. The invention also uses other techniques to reduce noise, and to reduce the noise transfer function in a power amplifier.

20 Claims, 4 Drawing Sheets

U.S. PATENT DOCUMENTS

| | | | |
|---|---|---|---|
| 6,630,861 B2 | 10/2003 | Kawaoka | 330/133 |
| 6,727,754 B2 | 4/2004 | Dupuis et al. | 330/254 |
| 6,741,127 B2 | 5/2004 | Sasho | 330/136 |
| 6,756,849 B2 | 6/2004 | Dupuis et al. | 330/279 |
| 6,771,122 B2 | 8/2004 | Jin et al. | 330/69 |
| 6,809,581 B2 | 10/2004 | Rofougaran et al. | 322/563 |
| 6,828,859 B2 | 12/2004 | Dupuis et al. | 330/279 |
| 6,836,185 B1 | 12/2004 | Pobanz | 330/260 |
| 6,894,565 B1 | 5/2005 | Bocock et al. | 330/285 |
| 2004/0174218 A1 | 9/2004 | Dupuis et al. | 330/285 |
| 2005/0068103 A1 | 3/2005 | Dupuis et al. | 330/251 |
| 2005/0134375 A1 | 6/2005 | Westwick et al. | 330/98 |
| 2005/0134376 A1 | 6/2005 | Westwick et al. | 330/98 |
| 2005/0134378 A1 | 6/2005 | Westwick et al. | 330/165 |
| 2005/0134386 A1 | 6/2005 | Westwick et al. | 330/301 |

\* cited by examiner

CIRCUIT AND METHOD OF ESTABLISHING DC BIAS LEVELS IN AN RF POWER AMPLIFIER

CROSS REFERENCE TO RELATED APPLICATIONS

This application is a continuation of commonly owned U.S. patent application Ser. No. 10/743,221, filed on Dec. 22, 2003, entitled "CIRCUIT AND METHOD OF ESTABLISHING DC BIAS LEVELS IN AN RF POWER AMPLIEJER," (U.S. Pat. No. 7,064,605). which is incorporated by referene herein.

FIELD OF THE INVENTION

This invention relates to power amplifiers. In particular, this invention relates to techniques for establishing DC bias levels in RF power amplifiers.

BACKGROUND OF THE INVENTION

In some applications of RF power amplifiers, noise can create problems. For example, in wireless communication systems, noise specifications are challenging. Some of the more difficult specifications to meet are for transmit noise appearing in the receive band. The ETSI GSM specification, for example, requires no more than −79 dBm noise power (measured in a 100 kHz bandwidth) between 935 MHz and 960 MHz, and the ETSI DCS specification requires no more than −71 dBm from 1805 MHz to 1880 MHz. Regardless of which specification a power amplifier is designed for, meeting the noise requirements of the specification is difficult.

Various factors make it difficult to meet the stringent noise specifications mentioned above. Power amplifiers having multiple nonlinear stages make the noise specification difficult to meet, since each gain stage contributes to the noise, and each stage can amplify and upconvert the noise of a previous stage. In addition, power amplifier designs that have a lot of active devices in the signal path, especially if slow devices are used, contributes to noise. In some power amplifier designs, it is not always sufficient to minimize the noise generated in the input stages. In these designs, it is also necessary to minimize the noise transfer function from the input stage to the output.

SUMMARY OF THE INVENTION

An RF power amplifier according to one illustrative embodiment of the invention includes first and second power amplifier stages. In one example, the power amplifier includes an amplifier with a first input coupled to the output of the first power amplifier stage and a second input coupled to the input of the first power amplifier stage for sensing the DC bias levels at the input and output of the first power amplifier stage. An output of the amplifier is coupled to the second power amplifier stage to control the DC bias level of the second power amplifier stage.

Another illustrative embodiment of the invention provides a method of establishing DC bias levels in a multistage RF power amplifier. A feedback signal is generated using the input and output of a first power amplifier stage. The feedback signal is used to control the DC bias level of a second power amplifier stage.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following description illustrates one example of a typical application of the present invention. A power amplifier using the techniques of the present invention may be used with a wireless transmission system such as a cellular or mobile telephone or other device. In a wireless device such as a cellular telephone, the wireless device may include a transceiver, an antenna duplexer, and an antenna. Coupled between the transceiver and the antenna duplexer is an RF power amplifier for amplifying signals for transmission via the antenna. In the case of a wireless telephone application, the invention may be applied to GSM, CDMA, PCS, DCS, etc., or any other wireless systems. This is just one example of an application of a power amplifier utilizing the present invention. The invention may also be used in any other application requiring a power amplifier. The invention may be implemented in any desired way. In one example, the power amplifier of the present invention is formed in a CMOS integrated circuit.

In general, the present invention provides DC stabilization and noise mitigation techniques to help reduce noise in a multistage power amplifier. The invention uses various feedback techniques to stabilize DC levels, which helps to reduce noise. The invention also uses other techniques to reduce noise in the circuit, or to reduce the transmission of noise from the input to the output of a power amplifier.

Figure 1:
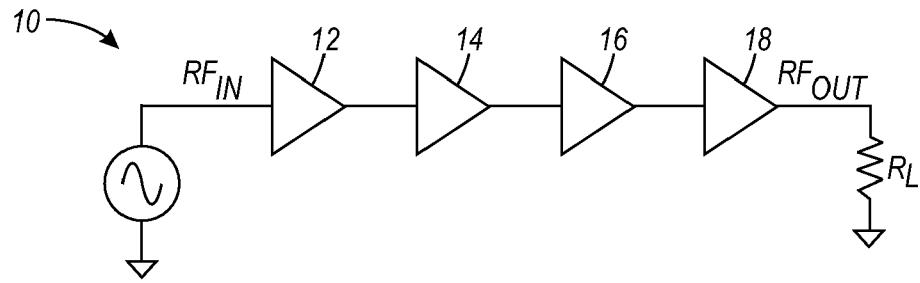
FIG. 1 is a block diagram of an exemplary multistage power amplifier, which may be used with the present invention.

FIG. 1 is a block diagram of an exemplary multistage power amplifier 10, which may be used with the present invention. The power amplifier 10 has a predriver 12 with an input connected to an RF input signal ($RF_{IN}$). The output of the predriver 12 is connected to three amplifier stages (first stage 14, second stage 16, and third stage 18). In one example, each amplifier stage is physically larger and provides higher output power than the stage that precedes it. The output ($RF_{OUT}$) of the third stage 18 is connected to a load $R_L$, which may be comprised of an antenna, in the example of a wireless or mobile communication system. Note that the invention may apply to many types of power amplifiers, having any desired number of stages. The predriver may be a unique stage that is specifically adapted to receive and condition the RF input signal, or it may be a general purpose amplifier stage.

Figure 2:
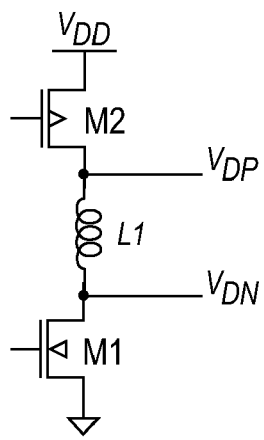
FIG. 2 shows one example of a complementary power amplifier architecture that may be used for the power amplifier stages shown in FIG. 1.

FIG. 2 shows one example of a complementary power amplifier architecture that may be used with the power amplifier stages 14, 16, and 18. Other architectures may also be used. FIG. 2 shows first NMOS switching device M1 and second PMOS switching device M2 coupled between a voltage source $V_{DD}$ and ground. An inductor L1 is connected between the switching devices M1 and M2. The drains of the switching devices M1 and M2 form output nodes $V_{DN}$ and $V_{DP}$.

Note that the type of power amplifier shown in FIG. 2 has two inputs and two outputs. This type of power amplifier is described in detail in commonly-owned U.S. Pat. No. 6,549,071, issued on Apr. 15, 2003, entitled "POWER AMPLIFIER CIRCUITRY AND METHOD USING AN INDUCTANCE COUPLED TO POWER AMPLIFIER SWITCHING DEVICES," which is expressly incorporated by reference herein.

Figure 3:
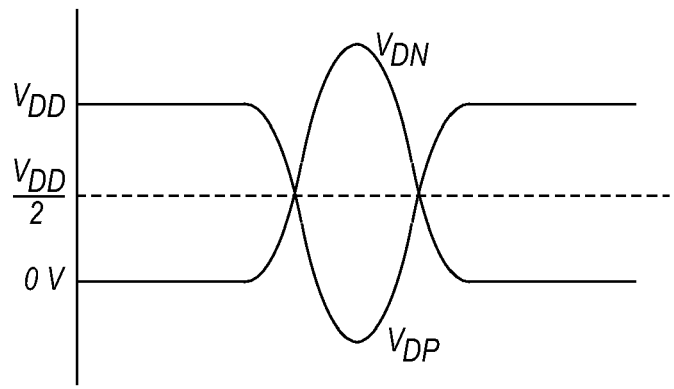
FIG. 3 is a plot showing the voltage waveforms at output nodes of the power amplifier shown in FIG. 2.

One goal of the present invention is to maximize the output power and efficiency of a power amplifier within the constraints of the breakdown voltages of the output transistors. In the power amplifier 10 shown in FIG. 1, one goal is to regulate the DC level of the third stage 18 (the output stage) so that the output signal swings on the PMOS and NMOS drains ($V_{DP}$ and $V_{DN}$ in FIG. 2) are balanced. FIG. 3 is a plot showing the voltage waveforms at output nodes $V_{DP}$ and $V_{DN}$ of the power amplifier shown in FIG. 2. Typically, the signal swings on $V_{DP}$ and $V_{DN}$ are balanced when their DC levels are approximately $V_{DD}/2$.

Figure 4:
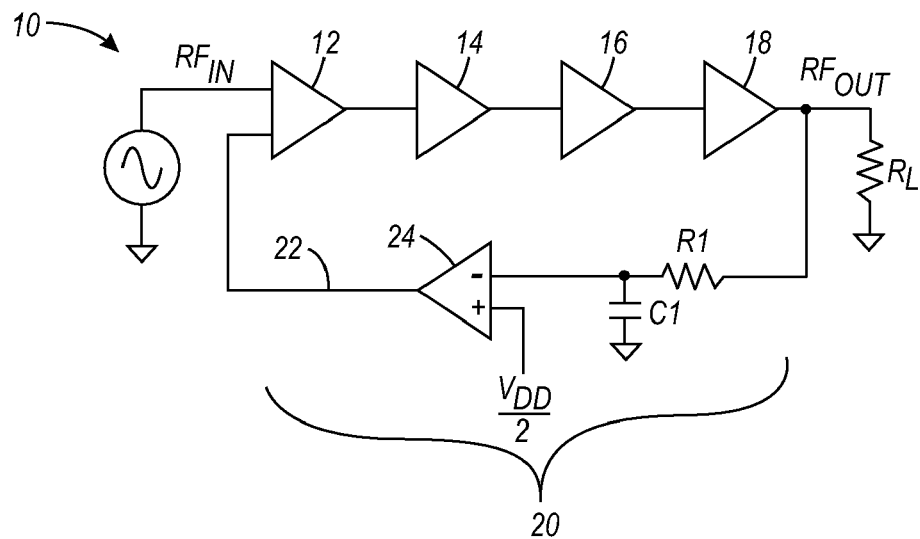
FIG. 4 is a diagram of the power amplifier using a global feedback signal.

One technique for setting the DC level of the output stage 18 is to use a global feedback signal. FIG. 4 is a diagram of the power amplifier 10 using a global feedback signal. Like FIG. 1, FIG. 4 shows a power amplifier having a predriver 12 and three power amplifier stages 14, 16, and 18. A feedback loop 20 is connected to the output of the output stage 18, and provides a feedback signal 22 to an input of the predriver 12. In this example, the output of the output stage 18 is coupled to one input of an op-amp 24 via a resistor R1 and capacitor C1. The other input to the op-amp 24 is connected to a reference voltage, in this example, $V_{DD}/2$.

The op-amp 24 compares the DC level of the output of the output stage 18 with the reference voltage $V_{DD}/2$ and generates the feedback signal 22 based on the comparison. The feedback signal 22 will adjust the DC level of the predriver 12, which will cause the DC level at the output stage 18 to be maintained at approximately $V_{DD}/2$. Note that any desired type of amplifier may be used, instead of an op-amp. This technique will produce optimal or near optimal bias points in all of the power amplifier stages for maximizing efficiency, but can be difficult to stabilize over all operating conditions, especially over load impedance. Following is a description of several design considerations with respect to the circuit shown in FIG. 4.

Figure 5:
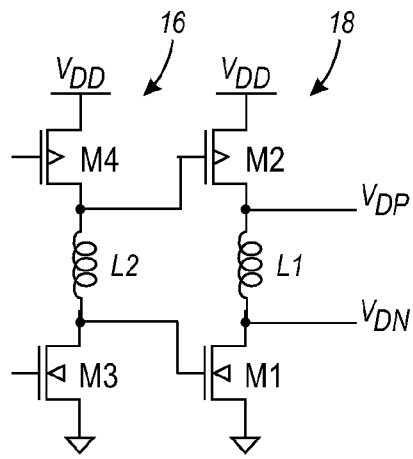
FIG. 5 shows two power amplifier stages using the power amplifier architecture shown in FIG. 2.

FIG. 5 shows power amplifier stages 16 and 18 using the power amplifier architecture shown in FIG. 4. FIG. 5 shows power amplifier stage 18 having an inductor L1 connected between switching devices M1 and M2. A power amplifier stage 16 has an inductor L2 connected between switching devices M3 and M4. The output of power amplifier stage 16 is connected to the input of power amplifier stage 18. It is assumed that an external bias circuit (not shown) sets the DC bias levels of stages 16 and 18 to be approximately $V_{DD}/2$.

Figure 6:
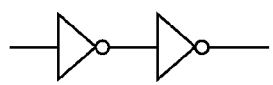
FIG. 6 shows two CMOS inverters having similar small-signal behavior as the power amplifier stages shown in FIG. 5.

In one example, inductors L1 and L2 are sized to form a resonant tank circuit with the total capacitance on the nodes to which they are coupled, with the resonant frequency set approximately equal to the amplifier's intended RF carrier frequency. At low signal frequencies (including DC), the inductors behave like short circuits, and the power amplifier stages shown in FIG. 5 have the same small-signal behavior as CMOS inverters 26, as illustrated in FIG. 6. As in the case with the circuit of FIG. 5, it is assumed that an external bias circuit sets the DC bias levels of the input and output of each inverter to be approximately $V_{DD}/2$.

Figure 7:
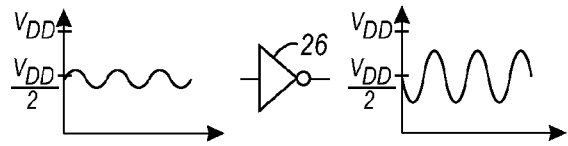
FIGS. 7 and 8 illustrate the behavior of the power amplifier stage described above in two situations.
Figure 8:
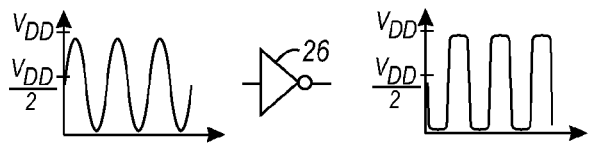

FIGS. 7 and 8 illustrate the behavior of a CMOS inverter, or one of the power amplifier stages described above at two situations. FIG. 7 shows the behavior of the CMOS inverter 26 in the presence of a small RF driving signal. As shown, the inverter 26 will operate as a linear amplifier and will have a large DC and low-frequency gain. For example, a small change in the DC level at the input will produce a large change in the DC level at the output.

In contrast, FIG. 8 shows the behavior of the CMOS inverter 26 with a large RF driving signal. As shown, the inverter 26 will have a much lower small-signal gain at low frequencies. The RF gain is fairly low in both cases. In two extreme situations, the generated noise is treated differently. First, when linear behavior is maintained through the whole chain of gain stages (e.g., predriver 12, stage 14, 16, and 18), a large amount of low-frequency noise will be present at the output, due to the cascade of high-gain stages which amplify any noise present at the input; but this noise is not a problem, since it does not appear in the sensitive RF frequency bands. Second, with a large RF input signal ($RF_{IN}$) and strongly nonlinear behavior through the whole chain of gain stages, low-frequency input noise will be modulated by the large RF signal and can be "up-converted" to RF frequencies above and below the RF signal frequency. However, since the overall gain is low, there will not be a lot of output noise at RF frequencies.

Therefore, if the input signal $RF_{IN}$ is strong and the operating conditions (e.g., process, temperature, voltage) result in strong transistors in the power amplifier, then the noise gains are usually low enough to meet the specifications. However, if there are fairly weak drive levels, especially in the predriver 12, the noise may be greatly amplified. This amplified noise is then upconverted into the receive band by the power amplifier stages, which are usually highly non-linear.

Figure 9:
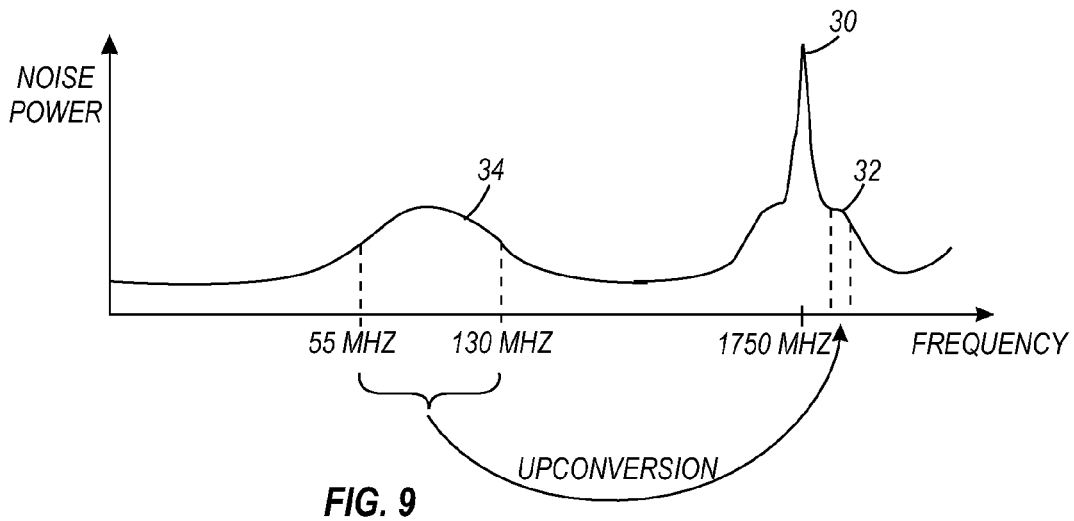
FIG. 9 shows the noise spectrum at the output power amplifier stage of a DCS power amplifier.

FIG. 9 shows a typical noise spectrum at the output power amplifier stage 18 used with a DCS power amplifier. FIG. 9 shows a peak 30, corresponding to the RF input or carrier frequency (in this example, 1750 MHz). The DCS receive band 32 (1805 MHz to 1880 MHz) is shown between the dashed lines, which corresponds to 55 MHz to 130 MHz above the carrier frequency. FIG. 9 also shows the portion 34 of noise in the range of 55 MHz to 130 MHz that is upconverted to the DCS receive band 32. In general, because the carrier can appear at any frequency inside the DCS transmit band (1710 MHz to 1785 MHz), any noise in the broader range of 20 MHz to 170 MHz can appear in the DCS receive band after upconversion.

Figure 10:
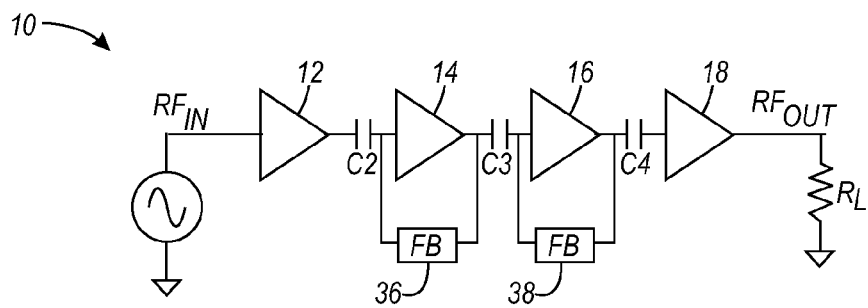
FIG. 10 shows a power amplifier using AC coupling capacitors and feedback circuits to help reduce noise.

Another technique for reducing noise in a multistage power amplifier is to use AC coupling capacitors between one or more power amplifier stages. FIG. 10 shows a power amplifier 10 having a predriver 12 and three power amplifier stages 14, 16, and 18. The first and second power amplifier stages 14 and 16 are coupled to feedback circuits 36 and 38, which function to set the DC levels of the power amplifier stages to desired levels. In one example, the feedback circuits cause the DC input and DC output levels of each power amplifier stage to be approximately equal. In addition, AC coupling capacitors C2, C3, and C4 are coupled on each side of power amplifier stages 14 and 16 to block the DC. In some implementations, this AC coupling technique may be impractical in later stages because large gate capacitances would require large coupling capacitors. This may also be impractical when the power amplifier is implemented on a chip, because of the size of the capacitors.

Figure 11:
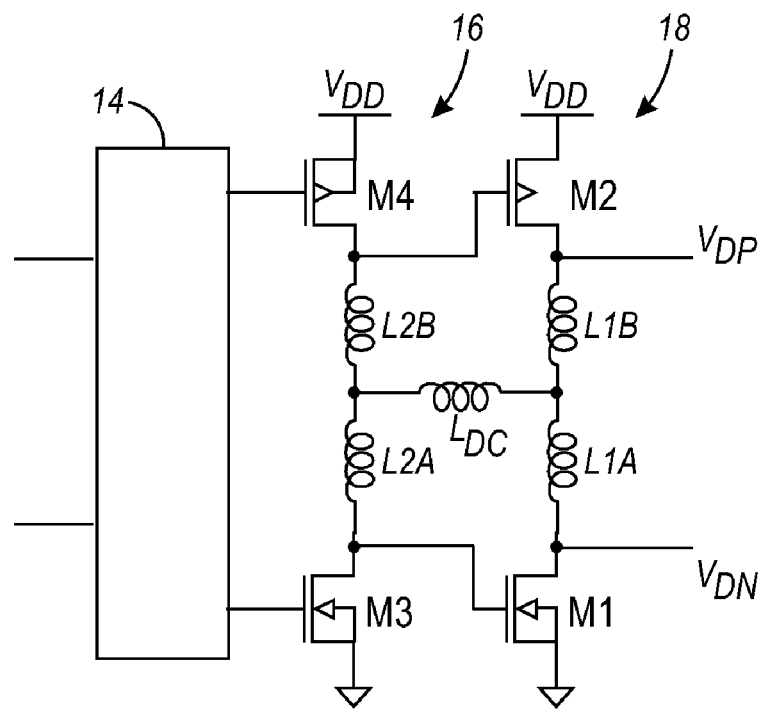
FIGS. 11–13 are diagrams of power amplifier using inductors or active circuits to help reduce noise.

Another technique for reducing noise and stabilizing DC levels in a power amplifier involves connecting an inductance between adjacent power amplifier stages. FIG. 11 is a diagram of power amplifier stages 14, 16, and 18 as described above. Between the second and third stages 16 and 18, an inductor $L_{DC}$ is connected to provide a feedback path from the output of stage 18 to stage 16 and forces the DC levels to be the same. In one example, the inductors L1 and L2 are replaced (or include a center tap) by inductors $L_{1A}$, $L_{1B}$ and inductors $L_{2A}$ and $L_{2B}$. The inductor $L_{DC}$ is connected to the node between inductors $L_{1A}$ and $L_{1B}$ and inductors $L_{2A}$ and $L_{2B}$. In this example, since the inductor $L_{DC}$ is connected to two nodes that are virtual grounds, the value of $L_{DC}$ is not critical.

Since a small inductor is easier to build than a large inductor, $L_{DC}$ is small in one example. At RF frequencies, inductor $L_{DC}$ has a non-negligible impedance. At DC and low frequencies, inductor $L_{DC}$ acts as a short or has a very low impedance. The circuit shown in FIG. 11 provides good noise performance. Inductor $L_{DC}$ causes all signals coming from the first power amplifier stage 14 that are below the tank circuit's resonant frequency to be attenuated, including the low frequency noise in the critical range of 20 MHz to 170 MHz, which could be upconverted to the receive band. This attenuation occurs because the DC and low-frequency noise levels at the output of stage 16 are now determined primarily by a feedback signal from stage 18 that passes through the low impedance of the inductor $L_{DC}$; thus the low-frequency noise at the output of stage 14 is blocked in stage 16.

Figure 12:
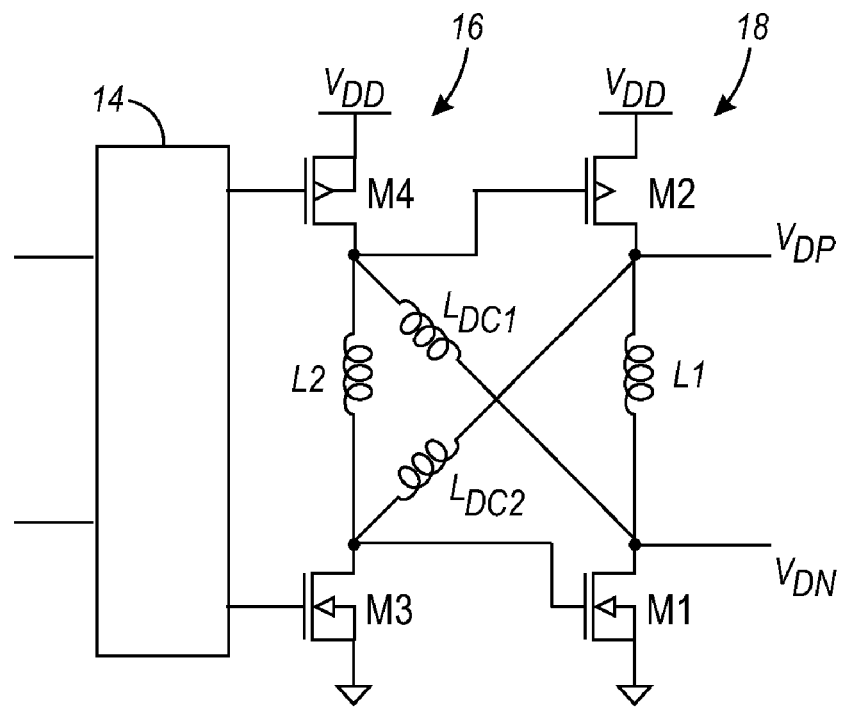

FIG. 12 is a diagram illustrating an alternative way of connecting an inductance between power amplifier stages 16 and 18. In FIG. 12, an inductance is provided by inductors $L_{DC1}$ and $L_{DC2}$ coupled between the output nodes of power amplifier stages 16 and 18 as shown. In theory, the noise improvement can be achieved by using an inductor or inductors to connect any point on inductor L1 to any point on inductor L2, since at DC and low frequencies the inductors are effectively short circuits. However, the circuit of FIG. 12 allows the use of smaller inductors $L_{DC1}$ and $L_{DC2}$ because the "diagonal" coupling means that both ends of each inductor are connected to nodes having the same RF signal phase, and hence any undesirable RF current through those inductors will be minimized without needing to use large inductance values.

Figure 13:
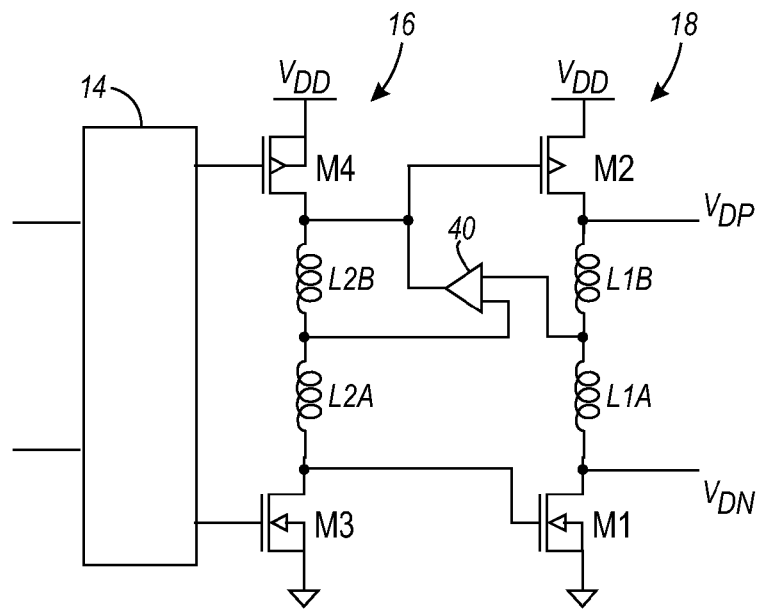

FIG. 13 is a diagram illustrating an alternative way of reducing noise and stabilizing DC levels. FIG. 13 shows power amplifier stages 14, 16, and 18 with an active feedback circuit coupled between stages 16 and 18. The feedback circuit includes an op-amp 40 having an input connected to each power amplifier stage 16 and 18 at the same point as inductor $L_{DC}$ shown in FIG. 11. The output of the op-amp 40 is connected to one of the output nodes of power amplifier stage 16 (which is also one of the input nodes of power amplifier stage 18). It is assumed that the op-amp 40 has a relatively high output impedance and that its bandwidth is much lower than the RF carrier frequency, so it has minimal impact on the operation of amplifiers 16 and 18 at the RF carrier frequency. The DC levels produced by the methods shown in FIGS. 11–13 are a function of the average drain-source resistance $R_{DS}$ of the third stage 18 PMOS and NMOS switching devices.

Figure 14:
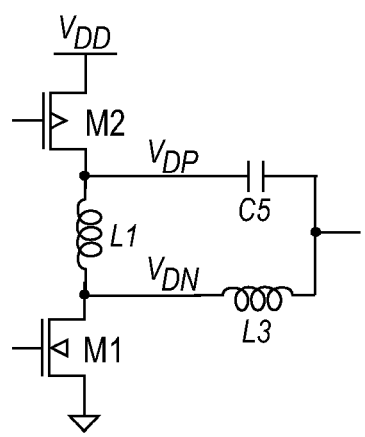
FIG. 14 is a diagram of a power amplifier stage and an impedance transformation network.

One issue to consider relates to the phase of noise. At the output of the final stage 18, an impedance transformation network is typically used. FIG. 14 is a diagram of a power amplifier stage and an impedance transformation network. In FIG. 14, a transformation network is formed by capacitor C5 and inductor L3. Of course, other types of transformation networks could also be used. At the output of the power amplifier 18, there is a large difference between correlated RF noise signals on the PMOS and NMOS drains (nodes $V_{DP}$ and $V_{DN}$) that are in-phase versus out-of-phase. Out-of-phase signals will add after they pass through the transformation network. In contrast, in-phase signals will cancel. Therefore, it is desirable for any noise to be in-phase, so that the noise is canceled out when it passes through the impedance transformation network. The DC level in the first power amplifier stage 14 has a strong influence on the phase of the noise that is present at the output stage 18 outputs. In general, when the first power amplifier stage 14 is biased so that the DC levels at its input and output are equal, the noise at the last power amplifier stage 18 drains is in-phase and much of the noise cancels in the transformation network. This biasing also produces the best first power amplifier stage 14 waveforms.

Figure 15:
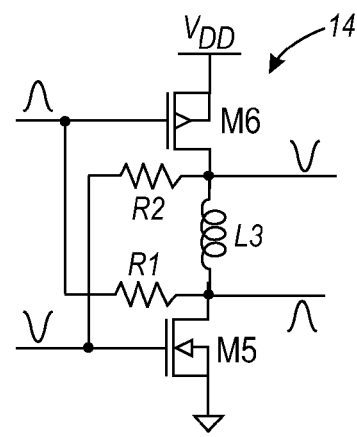
FIG. 15 is a diagram of power amplifier stage with resistors connected between the switching devices to minimize noise gain in the power amplifier.

Another technique to reduce noise involves coupling resistors between switching devices in a power amplifier stage. In the examples described above, this technique works best when applied to the first power amplifier stage 14. FIG. 15 is a diagram of power amplifier stage 14 with resistors connected between the switching devices M5 and M6 to minimize noise gain in the power amplifier. In the example shown in FIG. 15, a first resistor R1 is connected between the gate of switching device M6 and the drain of switching device M5. A second resistor R2 is connected between the gate of switching device M5 and the drain of switching device M6. FIG. 15 also illustrates the relative waveforms on the input and output nodes to illustrate the efficiency of the circuit.

The resistors R1 and R2 have little effect on efficiency because they are connected between nodes that have the same phase and similar magnitudes (i.e., little current will flow through those resistors). Resistors could be connected between the gate and drain of the same switching devices, but more current would flow through them, reducing the efficiency. In one example, the resistors R1 and R2 are 250 ohm resistors. The DC level in the first power amplifier stage 14 is set by the feedback loop (FIG. 4 above and FIG. 16 below), which is much stronger than the resistive feedback path provided by resistors R1 and R2. However, at the frequency range of 20 MHz to 170 MHz, the resitive feedback acts much the same as the inductive feedback shown in FIGS. 11–13.

Figure 16:
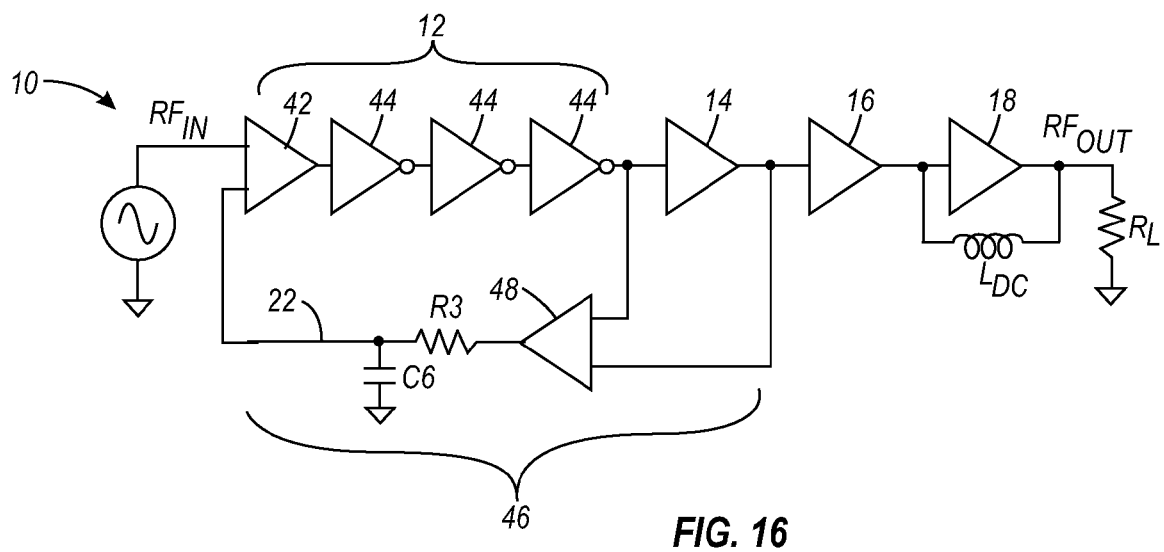
FIG. 16 is a diagram illustrating a power amplifier using various DC stabilization and noise reducing techniques of the present invention.

FIG. 16 is a diagram illustrating a power amplifier 10 using various DC stabilization and noise reducing techniques of the present invention. FIG. 16 shows a predriver 12, which is comprised of an amplifier 42 and a plurality of inverters 44 coupled in series forming an inverter string. The inverter string acts as a limiting amplifier that provides isolation between the latter stages of the power amplifier and the RF input. The output stage 18 of the power amplifier 10 uses the inductance $L_{DC}$ (FIG. 11) to reduce noise and stabilize the DC levels in the output stage 18. The first stage 14 uses a DC feedback circuit 46 to provide a feedback signal to the predriver circuit 12. An op-amp 48 is coupled to the input and output of the first power amplifier stage 14. The op-amp 48 compares the DC levels of the input and output of stage 14 and generates a feedback signal 22, which is provided to the predriver 12. The feedback signal 22 controls the DC level of the predriver such that the DC levels of the first power amplifier stage 14 have a predetermined relationship. In one example, the feedback signal 22 controls the DC level of the predriver such that the DC levels of the first power amplifier stage 14 are approximately equal to each other. In the circuit of FIG. 16, the first power amplifier stage 14 also may use resistors (shown in FIG. 15) to minimize noise gain.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

The invention claimed is:

1. A multi-stage RF power amplifier comprising;
   a first power amplifier stage configured to amplify an input signal to generate an amplified output signal;
   a second power amplifier stage; and
   a circuit coupled to the first and second power amplifier stages, wherein the circuit is configured to generate a feedback signal using the input and output signals of the first power amplifier stage, and wherein the circuit is configured to control the DC bias level of the second power amplifier stage.

2. The multi-stage RF power amplifier of claim 1, wherein the DC bias level is generated so as to cause the DC levels of the input and output signals of the first power amplifier stage to have a predetermined relationship.

3. The multi-stage RF power amplifier of claim 1, wherein the DC bias level is controlled to cause the DC levels of the input and output signals of the first power amplifier stage to be approximately equal.

4. The multi-stage RF power amplifier of claim 1, wherein the feedback signal is generated based on the DC levels of the input and output signals of the first power amplifier stage.

5. The multi-stage multi-stage RF power amplifier of claim 4, wherein the feedback signal is generated by comparing the DC levels of the input and output signals of the first power amplifier stage.

6. The multi-stage RF power amplifier of claim 1, wherein the feedback signal is used to set the DC levels at the input and output of the first power amplifier stage to approximately half of the supply voltage.

7. The multi-stage RF power amplifier of claim 1, wherein the second power amplifier stage is adapted to receive an RF input signal.

8. A method of operating an RF power amplifier having multiple power amplifier stages, comprising;
   providing a first power amplifier stage configured to amplify an input signal to generate an amplified output signal;
   providing a second power amplifier stage; and
   controlling the DC bias level of a second power amplifier stage based on the input and output signals of the first power amplifier stage.

9. The method of claim 8, wherein the DC bias level is generated to cause the DC levels at the input and output of the first power amplifier stage to have a predetermined relationship.

10. The method of claim 8, wherein the DC bias level is generated to cause the DC levels at the input and output of the first power amplifier stage to be approximately equal.

11. The method of claim 8, further comprising generating a feedback signal based on the input and output signals of the first power amplifier stage, wherein the DC bias level of a second power amplifier stage is controlled by the feedback signal.

12. The method of claim 11, wherein the feedback signal is generated based on the DC level at the input and output of the first power amplifier stage.

13. The method of claim 12, wherein the feedback signal is generated by comparing the DC levels at the input and output of the first power amplifier stage.

14. The method of claim 12, wherein the feedback signal is used to set the DC levels at the input and output of the first power amplifier stage to approximately half of the supply voltage.

15. The method of claim 8, wherein the second power amplifier stage is adapted to receive an RF input signal.

16. A method of establishing DC bias levels in an RF power amplifier having multiple power amplifier stages, comprising:
   providing a first power amplifier stage having an input and an output;
   sensing the DC bias level of the input of the first power amplifier stage;
   sensing the DC bias level of the output of the first power amplifier stage;
   generating a signal based on the sensed DC bias levels of the input and output of the first power amplifier stage; and
   using the generated signal to control the DC bias level of the second power amplifier stage.

17. The method of claim 16, wherein the DC bias level of the second power amplifier stage is controlled to cause the DC levels at the input and output of the first power amplifier stage to have a predetermined relationship.

18. The method of claim 16, wherein the DC bias level of the second power amplifier stage is controlled to cause the DC levels at the input and output of the first power amplifier stage to be approximately equal.

19. The method of claim 16, wherein the generated signal is generated by comparing the sensed DC bias levels at the input and output of the first power amplifier stage.

20. The method of claim 16, wherein the second power amplifier stage is adapted to receive an RF input signal.

* * * * *